(12) United States Patent
Tierno (10) Patent No.: US 6,650,699 B1
(45) Date of Patent: Nov. 18, 2003

(54) METHODS AND APPARATUS FOR TIMING RECOVERY FROM A SAMPLED AND EQUALIZED DATA SIGNAL

(75) Inventor: Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/234,767

(22) Filed: Jan. 21, 1999

(51) Int. Cl.[7] .................................................. H03H 7/30
(52) U.S. Cl. ....................... 375/232; 375/234; 375/235; 375/326; 375/344
(58) Field of Search ................................ 375/232, 222, 375/235, 234, 326, 344; 348/725, 726

(56) References Cited

U.S. PATENT DOCUMENTS

| 3,715,670 A | * | 2/1973 | Hirsch et al. ................ 375/232 |
| 4,021,738 A | * | 5/1977 | Citlin et al. ................. 375/232 |
| 4,061,978 A | | 12/1977 | Motley et al. ............... 375/232 |
| 4,815,103 A | | 3/1989 | Cupo et al. .................. 375/234 |
| 5,434,884 A | * | 7/1995 | Rushing et al. ............. 375/235 |
| 5,675,612 A | | 10/1997 | Solve et al. ................. 375/326 |
| 5,694,419 A | * | 12/1997 | Lawrence et al. .......... 375/222 |

* cited by examiner

Primary Examiner—Shuwang Liu
(74) Attorney, Agent, or Firm—Thu Ann Dang; Ryan, Mason & Lewis, LLP (57) ABSTRACT

Methods and apparatus for use in a communication channel receiver for generating a sampling phase error signal for adjustment of a sampling clock signal associated with the receiver are provided. In an illustrative embodiment, a method includes generating a signal representative of a weighted linear combination of a predetermined number of samples of a received input signal. The combination is a function of the samples and tap-weights of a finite impulse response filter associated with the receiver. Next, the illustrative method includes generating an error signal representative of the difference between an equalized sequence of samples of the received input signal and a decoded sequence of samples of the received input signal. Still further, the illustrative method includes multiplying the weighted linear combination signal with the error signal to generate a phase error signal. The phase error signal is then used to generate a phase correction signal for subsequent application to the sampling clock signal. Such application serves to adjust the sampling clock signal associated with the receiver such that the sampling clock signal substantially matches a data rate associated with the input signal.

26 Claims, 6 Drawing Sheets

METHODS AND APPARATUS FOR TIMING RECOVERY FROM A SAMPLED AND EQUALIZED DATA SIGNAL

FIELD OF THE INVENTION

The present invention relates generally to data channel receivers in the field of digital communications and, more particularly, to methods and apparatus for computing sampling phase errors for sampled and equalized data channel receivers.

BACKGROUND OF THE INVENTION

One of the basic problems of digital communications is to be able to extract the highest possible data rate from a given communication channel. This communication channel can have a number of different embodiments, e.g., coaxial cable, optic fiber, magnetic read/write circuit, radio link, etc.

A large class of communication channel circuits are designed to transmit discrete data at a constant rate. The data can be decoded at the receiving end by sampling the input signal at exactly the same rate (or multiple thereof) that the data was sent. No explicit timing information is sent with the data, as it would be too expensive in channel bandwidth. Thus, this timing information, or sampling clock, has to be recovered in some manner from the input signal.

Figure 1:
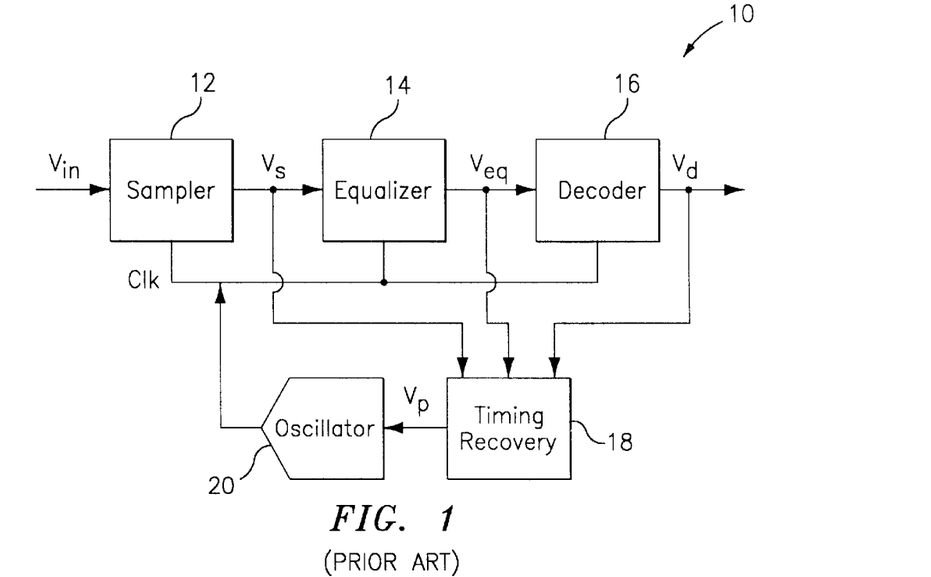
FIG. 1 is a block diagram of a conventional communication channel receiver.

FIG. 1 shows a generic communication channel receiver. The channel receiver 10 includes: a sampler 12 having an input terminal and an output terminal with the input terminal being coupled to the input terminal of the receiver 10; an equalizer 14 having an input terminal and an output terminal with the input terminal being coupled to the output terminal of the sampler 12; a decoder 16 having an input terminal and an output terminal with the input terminal being coupled to the output terminal of the equalizer 14 and the output terminal being coupled to the output terminal of the receiver 10; a timing recovery circuit 18 having input terminals and an output terminal with the input terminals being respectively coupled to the output terminals of the sampler 12, the equalizer 14, and the decoder 16; and an oscillator 20 having an input terminal and an output terminal with the input terminal being coupled to the output terminal of the timing recovery circuit 18 and the output terminal being respectively coupled to input clock terminals of the sampler 12, the equalizer 14, and the decoder 16. As is known, the oscillator 20 generates a clock signal, Clk, that is used by the other circuits within the receiver 10 that require the clock signal, i.e., the sampling circuit, the equalizing circuit, and the decoding circuit. The sampler 12 samples the input data signal, $V_{in}$, on one of the edges of the clock signal provided by the oscillator 12 and generates a sampled signal, $V_s$. The equalizer 14, typically a finite impulse response (FIR) filter, shapes the sampled input signal, $V_s$, to approximate a specific response that can be easily decoded. The decoder 16 then takes the equalized signal, $V_{eq}$, and computes an estimate of the original transmitted data in the form of an output signal, $V_d$, using a variety of methods such as, for example, thresholding, maximum likelihood, Viterbi, etc. The timing recovery circuit 18 uses the sampled data signal ($V_s$), the equalized data signal ($V_{eq}$), and the decoded data signal ($V_d$) to compute an adjustment signal, $V_p$, to the phase and frequency of the oscillator 20, so that the clock signal closely matches the input signal data rate.

One of the problems to be solved in the design of such a channel is to design a circuit that computes an estimate of the phase error of the sampling clock. This phase error is used to compute the phase correction that is applied to the oscillator. In the prior art, phase error is computed as follows. First, the difference between the equalized signal and the expected value of the equalized signal, $Err=V_{eq-Vd}$, is computed. Second, an estimate of the slope of the equalized signal, $S_{eq}$, at the sample point is computed. If the slope is positive and the error is positive, then a smaller error would have been realized by sampling earlier. Performing an analysis of the four possible cases (depending on the sign of $S_{eq}$ and Err), it is evident that the product $S_{eq} \times Err$ can be used as an estimate of the phase error.

This is an effective and well tested approach, but it has some drawbacks. First, for typical equalization targets (e.g., PRML or EPRML), the slope is often times zero, and no timing information can be extracted from this particular sample. It is to be understood that the "target" of the equalization process is the type of decoding performed by the decoding circuit of the receiver and, as such, the equalization process attempts to shape the sampled waveforms in order to provide a specific response that can be easily decoded according to the type of decoding performed. Second, estimating the slope of the signal is simple for simple targets, like PRML, but very complex for complex targets, like E2PRML. For high order targets, multiple sample values have to be examined, and the slope is derived from a large table. Third, if the circuit has to target multiple equalization targets, a separate circuit has to be designed to compute the slope for each target.

SUMMARY OF THE INVENTION

The present invention provides methods and apparatus for computing an estimate of the sampling phase error for a sampled and equalized data channel receiver. Advantageously, the methodologies of the invention are applicable to all equalization targets, have simple circuit implementations, and can be designed so that the same exact circuit can be used for multiple equalization targets.

In an illustrative embodiment of the invention, a method for use in a communication channel receiver of generating a sampling phase error signal for adjustment of a sampling clock signal associated with the receiver is provided. The illustrative method includes generating a signal representative of a weighted linear combination of a predetermined number of samples of a received input signal. The combination is a function of the samples and tap-weights of a finite impulse response filter associated with the receiver. A method of computing the weighted linear combination includes choosing a representative signal of the communications channel, and then choosing weights of the weighted linear combination to compute the phase error for the representative signal using gradient descent. Next, the illustrative method includes generating an error signal representative of the difference between an equalized sequence of samples of the received input signal and a decoded sequence of samples of the received input signal. Still further, the illustrative method includes multiplying the weighted linear combination signal with the error signal to generate a phase error signal. The phase error signal is then used to generate a phase correction signal for subsequent application to the sampling clock signal. Such application serves to adjust the sampling clock signal associated with the receiver such that the sampling clock signal substantially matches a data rate associated with the input signal. Accordingly, the receiver is able to extract the highest possible data rate from the communication channel.

The present invention finds application in various fields such as, for example, the fields of wired digital networks, wireless digital networks, optical disk (CD-ROM) and magnetic disk read channels. However, it is to be appreciated that such inventive teachings may be employed in other applications not explicitly enumerated herein.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention provides methods and apparatus for computing an estimate of the sampling phase error in a sampled and equalized data channel. This results in a simple, efficient circuit that can be used to keep track of the sampling phase of the channel for multiple equalization targets. The method described herein uses gradient descent to compute the error measure. This method can be used to generate generic phase error equations that are independent of the equalization target, so that the same circuit can be used for multiple targets. More specific equations can also be generated, to optimize the phase error measure for a specific target, or to reduce the circuit complexity for a specific target.

Figure 2:
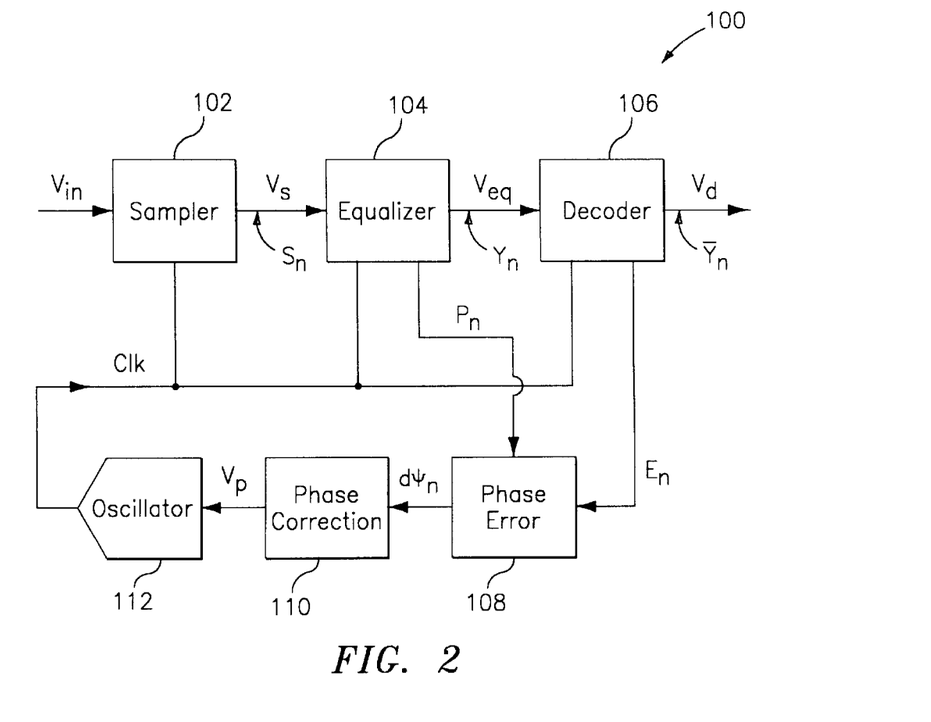
FIG. 2 is a block diagram of a communication channel receiver according to an illustrative embodiment of the present invention.

Referring now to FIG. 2, a communication channel receiver according to an illustrative embodiment of the invention is shown. The channel receiver 100 includes: a sampler 102 having an input terminal and an output terminal with the input terminal being coupled to the input terminal of the receiver 100; an equalizer 104 having an input terminal and output terminals with the input terminal being coupled to the output terminal of the sampler 102; a decoder 106 having an input terminal and output terminals with the input terminal being coupled to one of the output terminals of the equalizer 104 and one of its output terminals being coupled to the output terminal of the receiver 100; a phase error computation circuit 108 having input terminals and an output terminal with the input terminals being respectively coupled to the other of the output terminals of the equalizer 104 and the decoder 106; a phase correction circuit 110 having an input terminal and an output terminal with the input terminal being coupled to the output terminal of the phase error computation circuit 108; and an oscillator 112 having an input terminal and an output terminal with the input terminal being coupled to the output terminal of the phase correction circuit 110 and the output terminal being respectively coupled to input clock terminals of the sampler 102, the equalizer 104, and the decoder 106.

The sampler 102 samples the input signal, $V_{in}$, to yield a sampled signal, $V_s$. The sampler 102 may employ any form of sampling circuit known to those skilled in the art and, as such, the specific type of sampling circuit is not critical to the invention. Let $S_n$, be the sequence of values sampled by the sampler 102. The samples are then presented to the equalizer 104 which generates an equalized signal, $V_{eq}$. Let $Y_n$ be the sequence of equalized values at the output of the equalizer 104. An illustrative embodiment of an equalizer circuit will be explained below in the context of FIG. 3. The computation performed by the equalizer corresponds to a finite impulse response filter, or FIR filter, and is expressed as:

$$Y_N = \sum_{i=0}^{m-1} t_i \times S_{n-i} \qquad (1)$$

In equation (1), m is a fixed value and represents the order of the FIR filter, and $t_0, t_1, \ldots, t_{m-1}$ are also fixed values and represent the tap-weights of the FIR filter.

The sequence of equalized values $Y_n$ is presented to the decoder 106 which decodes the sequence in accordance with the decoding scheme being employed. As mentioned, the decoder 106 may be of any type known to those skilled in the art. That is, since the phase error computation methodology of the invention is independent of the decoding scheme, the particular decoding scheme is not critical and, as such, any known decoding circuit (e.g., thresholding, maximum likelihood, Viterbi, etc.) may be employed. Let $\overline{Y}_n$ be the sequence of expected values of the equalized signal, at the output of the channel decoder 106. Let $E_n$ be the sequence of signal errors, defined by $E_n = Y_n - \overline{Y}_n$. Accordingly, by substituting in equation (1) for $Y_n$, $E_n$ may be expressed as:

$$E_n = \left( \sum_{i=0}^{m-1} t_i \times S_{m-i} \right) - \overline{Y}_n \qquad (2)$$

Now, it is a goal to adjust the sampling phase so as to minimize the sum of the squares of the errors, or $\Sigma_n E_n^2$. That is, the feed-back loop including the phase error circuit 108 and the phase correction circuit 110 serves to adjust the sampling phase associated with the clock signal generated by the oscillator 112. The clock signal, Clk, is the clock signal which is used to sample the input signal and provide timing control to the equalizer 104 and the decoder 106. To this end, the present invention in effect provides for identifying a set of adjusted tap weights, $t_i+dt_i$, that improve the sum-square error. Using gradient descent as will be explained, the present invention provides that:

$$dt_i = -d \times E_n \times S_n \quad i=0, \ldots, m-1 \tag{3}$$

where d is a positive constant. It is to be appreciated that these values $dt_i$ can be interpreted in two ways. One way is as an improvement on the equalization coefficients employed by the equalization circuit of the receiver, i.e., allowing the equalizer to better approximate its target. The second way to interpret the values $dt_i$, and the way implemented according to the invention, is as a sampling phase correction. That is, instead of updating the FIR tap weights, a sampling phase correction that has the same effect as that update is advantageously generated. To do so, the effect that such an update has on the phase delay of the FIR at a chosen frequency must be computed. This frequency is chosen according to the characteristics of the channel.

For example, if we choose the center frequency of the channel, or $S_n = \sin(\frac{1}{2}n\pi + \phi)$, we get:

$$Y_n = \sum_{i=0}^{m-1} t_i \times \sin\left(\frac{1}{2}(n-i)\pi + \phi\right) = M \times \sin\left(\frac{1}{2}n\pi + \phi + \psi\right) \tag{4}$$

$$M = \sqrt{A^2 + B^2} \tag{5}$$

$$\psi = \arctan\left(\frac{B}{A}\right) \tag{6}$$

$$A = t_0 - t_2 + t_4 - \tag{7}$$

$$B = t_1 - t_3 + t_5 - \tag{8}$$

The $dt_i$'s are used to compute a sampling phase error, $d\psi$:

$$d\psi = \arctan\frac{(B+dB)}{(A+dA)} - \arctan\left(\frac{B}{A}\right) \tag{9}$$

$$\approx \frac{1}{M^2}(A \times dB - B \times dA) \tag{10}$$

$$\approx \frac{-d \times E_n}{M^2} \times (A(S_{n-1} - S_{n-3} + S_{n-5} - \ldots) - \tag{11}$$

$$(B(S_n - S_{n-2} + S_{n-4} - \ldots))$$

Advantageously, equation (11) illustrates that an estimate of the sampling phase error can be derived from the product of three values. The first one is an arbitrary positive constant d. The second one is the error signal, $E_n$. The third one is a weighed linear combination of the last m samples, hereinafter represented as $P_n$. Further, equation (11) shows how to compute the weights in a particular case. It is to be understood that the phase error $d\psi_n$ is computed by the phase error computation circuit 108 based on input of the three values. Illustrative embodiments of a phase error circuit 108 will be explained below in the context of FIGS. 5 and 6.

The constant d is arbitrary and can be set, for example, to 1. A primary purpose of the constant d is to set the gain in the feed-back loop. The constant d may be preset and stored for access during operation in memory (not shown) associated with the receiver 100. Further, this gain can be absorbed by the next stage of the feed-back loop, that is, in the phase correction circuit 110 of FIG. 2.

The second term, $E_n$, is preferably computed by the decoder 106. However, it may also be computed by the phase error computation circuit 108, as will be seen. The computation of the error, $E_n$, requires the decoded value of the input, $V_d$, and the equalized value of the input, $V_{eq}$, that is, $E_n = V_{eq} - V_d$. The equalized and decoded values of the input signal, $V_{in}$, are available in the decoder already, as $E_n$ is typically computed as a part of any decoding process that the decoder 106 may perform.

Figure 3:
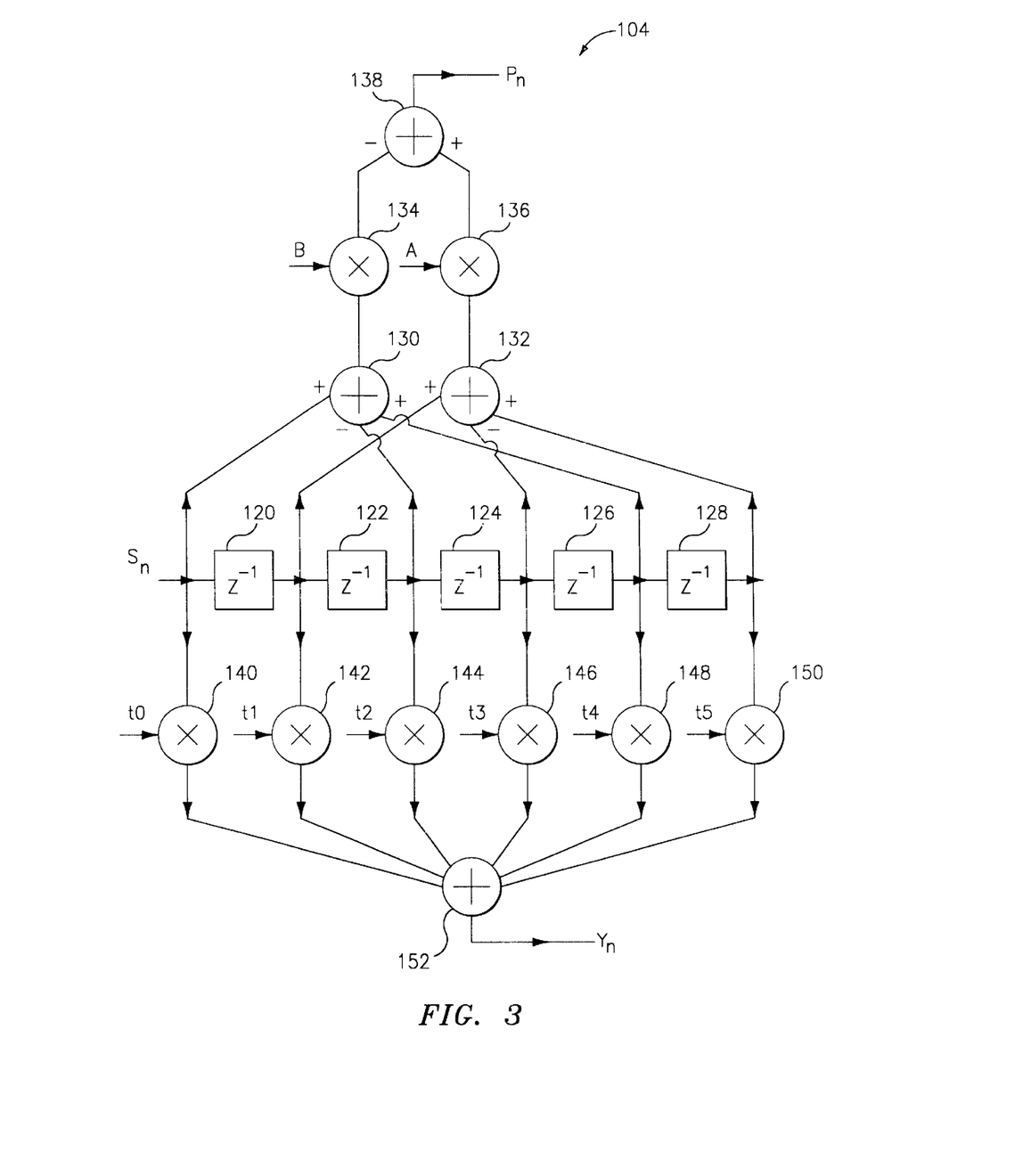
FIG. 3 is a schematic diagram of a circuit for implementing an equalization finite impulse response with phase error pre-computation according to an illustrative embodiment of the present invention.

The third term, $A(S_{n-1} - S_{n-3} + S_{n-5} - \ldots) - B(S_n - S_{n-2} + S_{n-4} - \ldots)$, or $P_n$, is preferably computed in the equalizer 104. All the data necessary to perform this computation is present in the equalizer and the extra operations can be done with some amount of circuit overhead. Referring now to FIG. 3, an illustrative embodiment of an equalizer 104 for performing this computation is shown. The equalizer 104 includes a set of delays 120 through 128, a pair of adders 130 and 132, a pair of multipliers 134 and 136, and an adder 138 for generating the sequence $P_n$. The equalizer 104 also uses the delays 120 through 128 and further includes a set of multipliers 140 through 150, and an adder 152 for generating the equalized sample sequence $Y_n$. Each sample of $S_n$ from sampler 102 is subjected to the set of delays such that the a set of delayed samples is generated for each sample. That is, delay 120 generates delayed sample $S_{n-1}$, delay 122 generates delayed sample $S_{n-2}$, and so on up to delay 128 which generates delayed sample $S_{n-5}$. It is to be appreciated that FIG. 3 illustrates a limited number of stages (5) for exemplary purposes only and, as such, the invention is not limited thereto. The original sample and the delayed samples are then provided to the pair of adders 130 and 132 to generate the respective sequences $(S_n - S_{n-2} + S_{n-4})$ and $(S_{n-1} - S_{n-3} + S_{n-5})$. Next, the sequences are respectively provided to the pair of multipliers 134 and 136 were they are multiplied by the values B (equation (8)) and A (equation (7)). The products are added (with the output of the multiplier 134 being inverted) to yield the sequence $P_n$, that is, $A(S_{n-1} - S_{n-3} + S_{n-5}) - B(S_n - S_{n-2} + S_{n-4})$. The equalized sample sequence $Y_n$ is generated by multiplying the original sample and the delayed samples by respective tap weights ($t_0$ through $t_5$) via multipliers 140 through 150 and then adding the products in adder 152.

Figure 4:
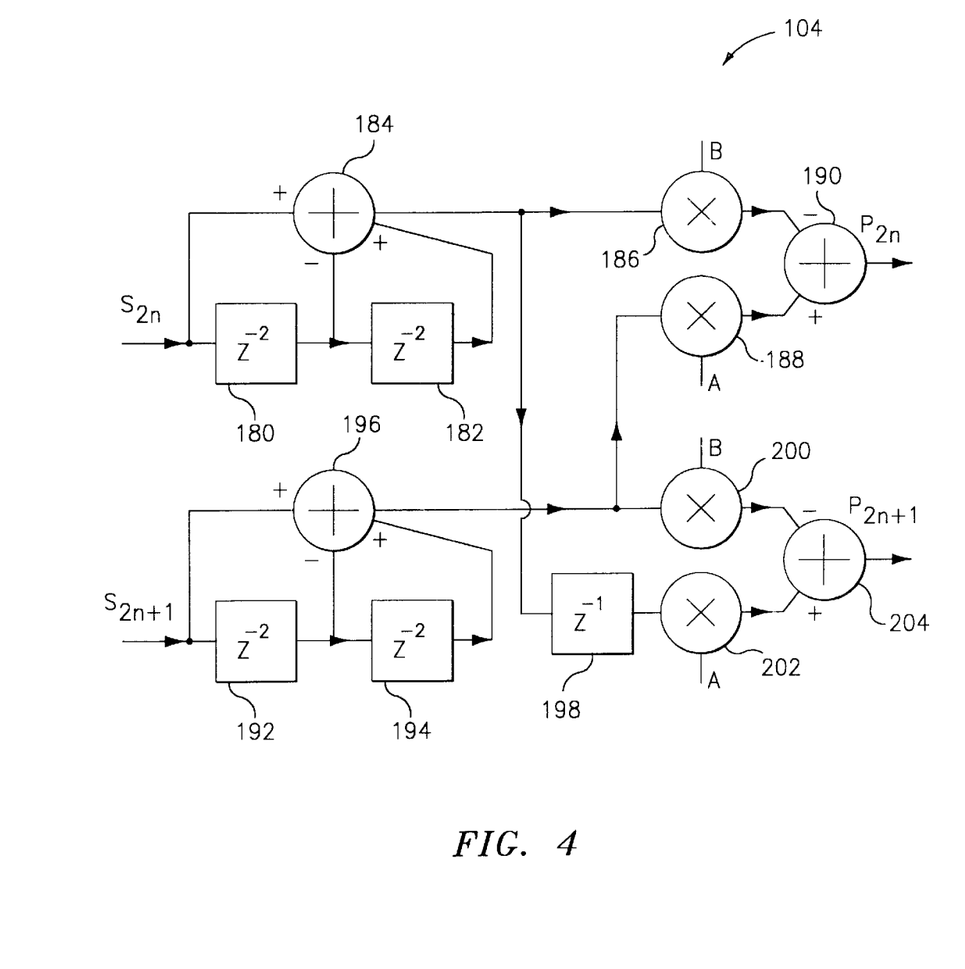
FIG. 4 is a schematic diagram of a circuit for implementing an interleaved architecture for phase error pre-computation according to an illustrative embodiment of the present invention.

The phase error pre-computation methodology of the invention can be easily adapted to an interleaved architecture. In such an embodiment, hardware utilization is optimized. It is to be understood that it may be necessary to use an interleaved architecture, if the data rate is too high for a full rate implementation. Referring to FIG. 4, an example of an interleaved architecture approach to the equalization circuit in the equalizer 104 is shown. In this embodiment, the equalization circuit 104 includes: a first stage including a set of delays 180 and 182, a first adder 184, a pair of multipliers 186 and 188, and a second adder 190; and a second stage including a set of delays 192 and 194, a first adder 196, another delay 198, a pair of multipliers 200 and 202, and a second adder 204. Given the delay values and the sign conventions, it is evident that the sequence $P_{2n}$ output by the first stage in response to the samples $S_{2n}$ and $S_{2n+1}$ is equivalent to $A(S_{2n+1} - S_{2n-1} + S_{2n-3}) - B(S_{2n} - S_{2n-2} + S_{2n-4})$. Similarly, it is evident that the sequence $P_{2n+1}$ output by the second stage in response to the samples $S_{2n}$ and $S_{2n+1}$ is equivalent to $A(S_{2n+2} - S_{2n} + S_{2n-2}) - B(S_{2n+1} - S_{2n-1} + S_{2n-3})$.

Assuming that the constant d is assigned a value of one (1), the computation of the phase error $d\psi$ by the phase error computation circuit 108 now becomes the multiplication of two values, $P_n$ and $E_n$, that are generated by the target-dependent portions of the data channel, that is, the equalizer 104 and the decoder 106, respectively. Further simplifications are possible. We can use just the sign bit of either or both $E_n$ and AdB-BdA. Then, the multiplication is as simple as one XOR gate.

Figure 5:
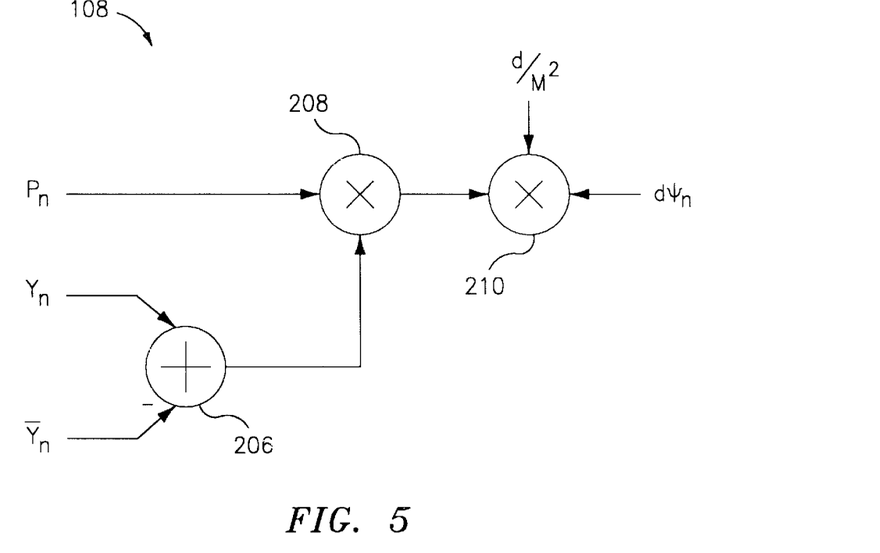
FIG. 5 is a schematic diagram of a non-interleaved circuit for generating a phase error signal according to an illustrative embodiment of the present invention.

Referring now to FIG. 5, an illustrative embodiment of a phase error computation circuit 108 is shown. While it has been mentioned that the error signal $E_n$ may be generated by the decoder 106 as part of its conventional decoding process, the illustrative embodiment of FIG. 5 illustrates the generation of the signal $E_n$ in the phase error computation circuit 108. Accordingly, the phase error computation circuit 108 of FIG. 5 includes an adder 206, and a set of multipliers 208 and 210. The adder 206 receives the equalized output signal $Y_n$ from the equalizer 104 and the inverted decoded output signal $\overline{Y}_n$ from the decoder 106 and adds the two signals to generate the error signal $E_n$. It is to be appreciated that the decoded output signal may be inverted by an inverter (not shown) or by simply implementing the appropriate sign convention in the adder 206. Next, the output signal $P_n$ from the equalizer 104 is multiplied in multiplier 208 with the error signal $E_n$. The resulting product signal is then multiplied by a signal representing the constant $d/M^2$ to yield the phase error signal $d\psi_n$. As is evident, this circuit implementation of phase error computation according to the invention is equivalent to the computation defined in equation (11).

Figure 6:
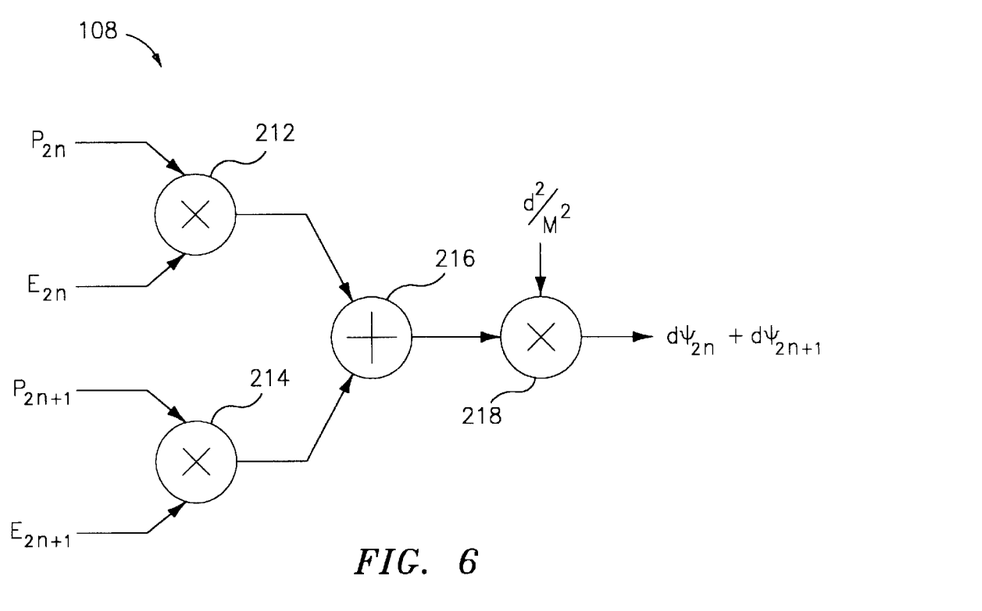
FIG. 6 is a schematic diagram of an interleaved circuit for generating a phase error signal according,to an illustrative embodiment of the present invention.

Referring now to FIG. 6, an illustrative embodiment of an interleaved phase error computation circuit 108 is shown. The interleaved embodiment includes a pair of multipliers 212 and 214, an adder 216, and a multiplier 218. Accordingly, the multiplier 212 multiplies the signals representing $P_{2n}$ and $E_{2n}$ and the multiplier 214 multiplies the signals representing $P_{2n+1}$ and $E_{2n+1}$. The respective products are added in adder 216, the result of which is then multiplied with the signal representing the constant $d^2/M^2$ to yield the interleaved phase error signal $d\psi_{2n}+d\psi_{2n+1}$.

Figure 7:
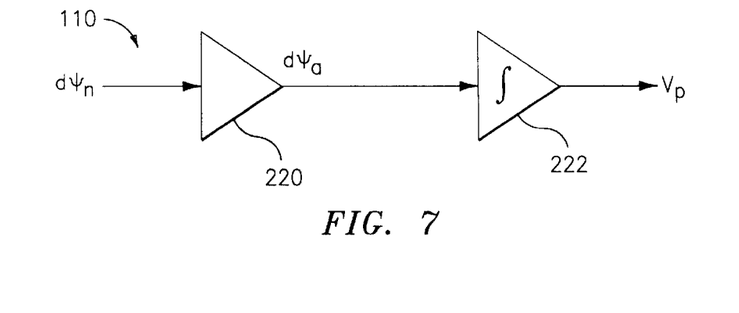
FIG. 7 is a schematic diagram of an illustrative circuit for generating a phase correction signal from a phase error signal generated according to the present invention.

After the phase error signal $d\psi_n$ is generated by the phase error computation circuit 108, it is provided to the phase correction circuit 110. Referring to FIG. 7, an illustrative embodiment of a phase correction circuit 110 is shown. The phase error computation circuit 110 of FIG. 7 includes a digital-to-analog (D/A) converter 220 and an integrator 222. Specifically, in this embodiment, the phase error signal $d\psi_n$ is converted from a discrete signal to an analog signal $d\psi_a$ in the D/A converter 220 and then integrated by the integrator 222 to generate the phase correction signal $V_p$. It is this phase correction signal $V_p$ which is applied to the clock signal in the oscillator 112 such that the phase and frequency of the clock signal, Clk, is adjusted to match the input signal data rate.

Figure 8:
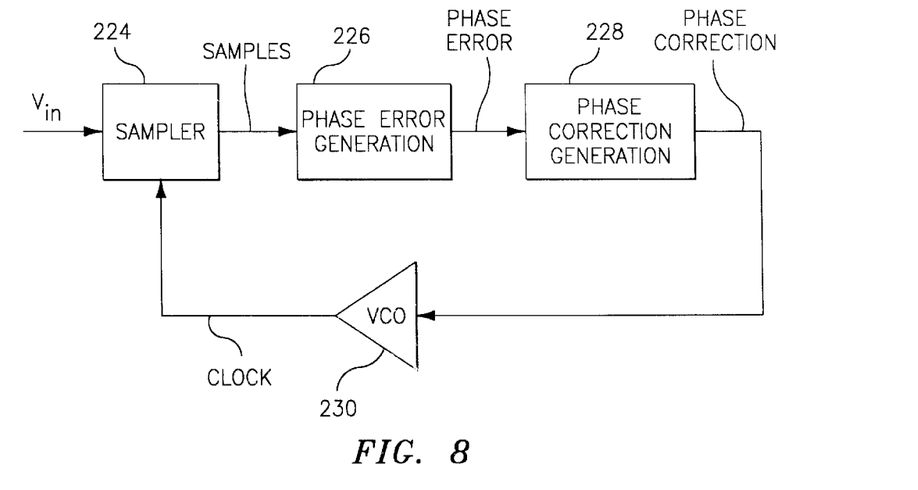
FIG. 8 is a block diagram of an illustrative phase locked loop circuit formed according to the present invention.

It is to be understood that given the fact that any conventional oscillator circuit may be employed as oscillator 112, one of ordinary skill in the art will contemplate various manners for adjusting the clock signal in accordance with the adjustment signal, $V_p$. In a preferred embodiment, the oscillator is a voltage controlled oscillator (VCO). As such, it is evident with reference to FIG. 8 that the stages of a communication channel receiver of the invention form a phase locked loop in adjusting the sampling clock to match the input signal data rate. That is, the sampling stage 224 (e.g., formed by the sampler 102), the phase error generation stage 226 (e.g., formed by the equalizer 104, the decoder 106, and the phase error computation circuit 108), the phase correction stage 228 (e.g., formed by the phase correction circuit 110), and VCO clock generation stage 230 (e.g., formed by the oscillator 112) form a phase locked feedback loop in order that the appropriate sampling clock is recovered from the input data signal.

Figure 9:
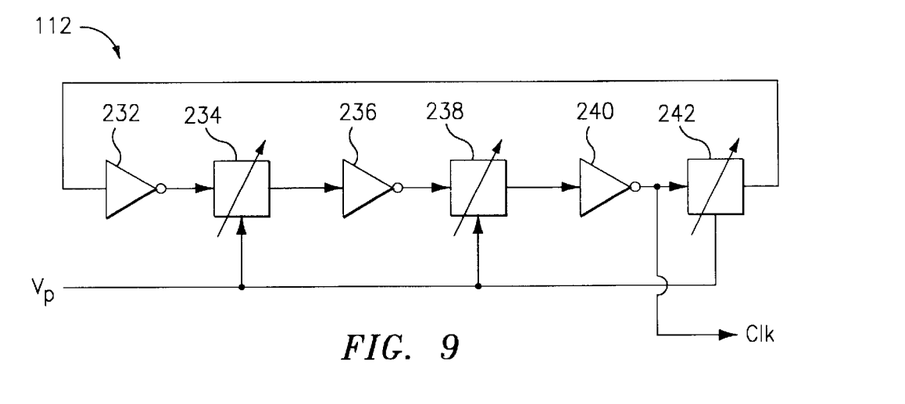
FIG. 9 is a schematic diagram of an illustrative oscillator circuit for applying a phase correction signal to a clock signal.

Referring to FIG. 9, an illustrative embodiment of a voltage controlled oscillator for implementing the oscillator circuit 112 is shown. In this embodiment, a voltage controlled oscillator includes a plurality of variable delay stages including inverters 232, 236, 240 and variable delays 234, 238, 242. More or less stages may be employed. As is known in the art, an analog signal such as $V_p$ is provided to each variable delay in order to adjust the phase and frequency of the clock signal Clk. As the desired, a clock signal may be output at different stages of the circuit. Here, the clock signal Clk is shown output from inverter 240. Advantageously, the clock signal Clk is adjusted by the phase correction signal $V_p$, which is generated in accordance with the phase error signal $d\psi_n$, itself generated using gradient descent according to the teachings of the invention explained above.

Figure 10:
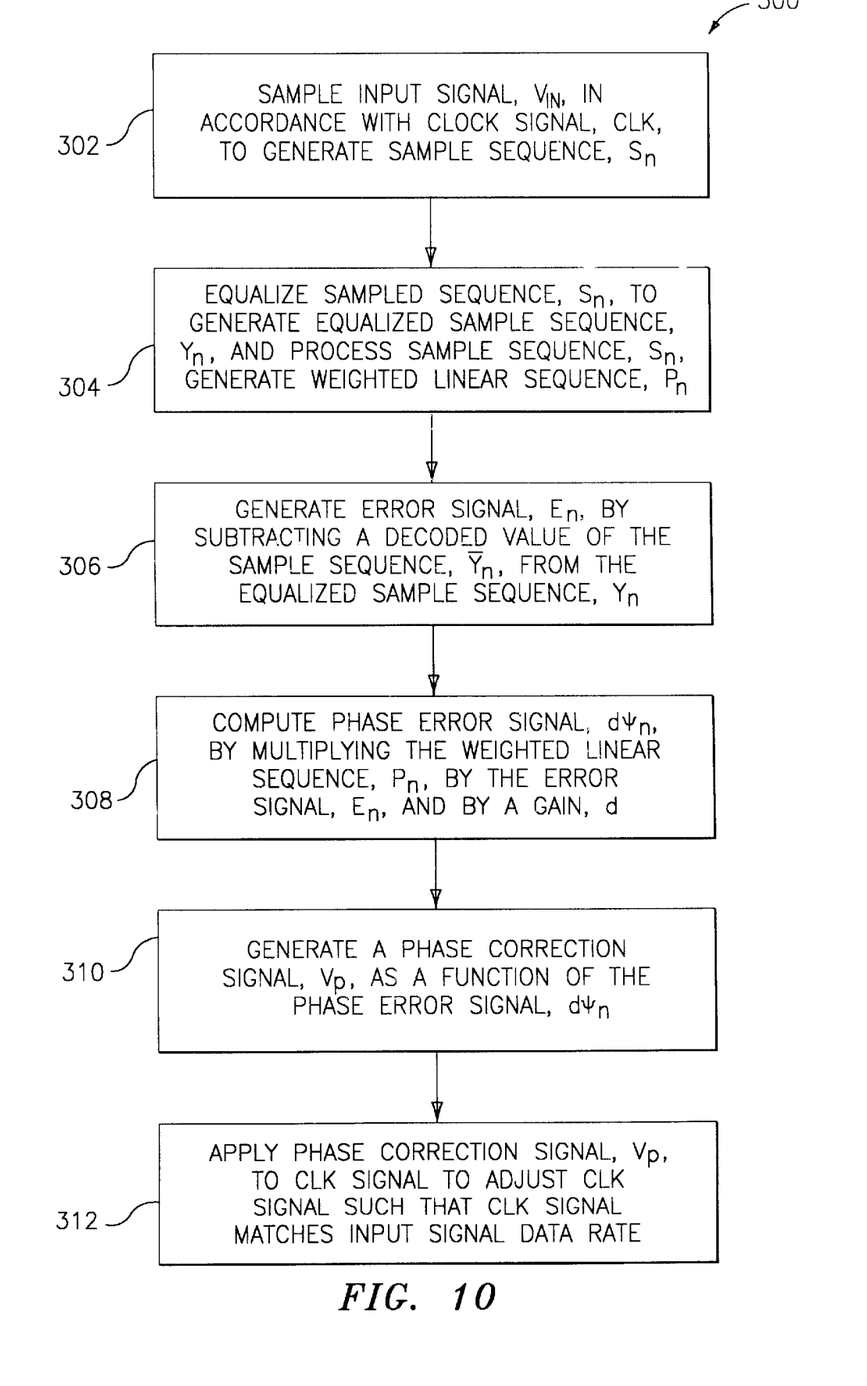
FIG. 10 is a flow chart of a method of processing a received signal from a communication channel with sampling clock correction according to an illustrative embodiment of the present invention.

Referring now to FIG. 10, a flow chart of an illustrative embodiment of a communication channel sampling phase correction method 300 according to the invention is shown. In step 302, an input signal, $V_{in}$, is sampled according to a clock signal, Clk, to generate a sample sequence, $S_n$. Next, in step 304, the sample sequence, $S_n$, is equalized to generate an equalized sample sequence, $Y_n$. Also, in step 304, the sample sequence, $S_n$, is processed to generate a weighted linear combination of a predetermined number of samples, $P_n$. The weighted linear combination, $P_n$, is preferably generated by respectively multiplying combinations of sample sequences with combinations of tap-weights associated with a finite impulse response and adding the products of the multiplication. Next, in step 306, an error signal, $E_n$, is generated by subtracting a decoded value of the sample sequence, $\overline{Y}_n$, from the equalized sample sequence, $Y_n$. In step 308, the signals representing the weighted linear sequence, $P_n$, the error, $E_n$, and a gain constant d are multiplied to generate a phase error signal, $d\psi_n$. From the phase error signal, $d\psi_n$, a phase correction signal, $V_p$, is generated in step 310. Lastly, in step 312, the phase correction signal, $V_p$, is then applied to the clock signal, Clk, in order to adjust the clock signal such that the clock signal matches the input signal data rate.

It is to be appreciated that while specific circuit embodiments of the methodologies of the invention have been provided and explained above, such inventive methodologies including other processes performed by a communication channel receiver may be implemented, for example, by one or more digital signal processors with associated memory, application specific integrated circuit(s), one or more appropriately programmed general purpose digital computers with associated memory. One of ordinary skill in the art will contemplate various other ways of implementing the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for use in a communication channel receiver of generating a sampling phase error signal for adjustment of a sampling clock signal associated with the receiver, the method comprising the steps of:

generating a signal representative of a weighted linear combination of a predetermined number of samples of a received input signal, the combination being a function of the samples and tap-weights of a finite impulse response filter associated with the receiver;

generating an error signal representative of the difference between an equalized sequence of samples of the received input signal and a decoded sequence of samples of the received input signal; and multiplying the weighted linear combination signal with the error signal to generate a phase error signal for adjusting the sampling clock signal associated with the receiver such that the sampling clock signal substantially matches a data rate associated with the input signal;

wherein computation of the weighted linear combination includes:
choosing a representative signal of the communications channel; and
choosing weights of the weighted linear combination to compute the phase error for the representative signal using gradient descent.

2. A method for use in a communication channel receiver of generating a sampling phase error signal for adjustment of a sampling clock signal associated with the receiver, the method comprising the steps of:

generating a signal representative of a weighted linear combination of a predetermined number of samples of a received input signal, the combination being a function of the samples and tap-weights of a finite impulse response filter associated with the receiver;

generating an error signal representative of the difference between an equalized sequence of samples of the received input signal and a decoded sequence of samples of the received input signal;

multiplying the weighted linear combination signal with the error signal; and multiplying the product of the weighted linear combination signal and the error signal by a constant value to generate a phase error signal for adjusting the sampling clock signal associated with the receiver such that the sampling clock signal substantially matches a data rate associated with the input signal.

3. A method for use in a communication channel receiver of generating a sampling phase error signal for adjustment of a sampling clock signal associated with the receiver, the method comprising the steps of:

generating a signal representative of a computed weighted linear combination of a predetermined number of samples of a received input signal, the combination being a function of the samples and tap-weights of a finite impulse response filter associated with the receiver;

generating an error signal representative of the difference between an equalized sequence of samples of the received input signal and a decoded sequence of samples of the received input signal;

multiplying the weighted linear combination signal with the error signal to generate a phase error signal for adjusting the sampling clock signal associated with the receiver such that the sampling clock signal substantially matches a data rate associated with the input signal; and generating a phase correction signal as a function of the phase error signal;

wherein a computation of the weighted linear combination includes:
choosing a representative signal of the communications channel; and
choosing weights of the weighted linear combination to compute the phase error for the representative signal using gradient descent.

4. The method of claim 3, further comprising the step of applying the phase correction signal to the sampling clock signal in order to adjust the sampling clock signal.

5. A method for use in a communication channel receiver of generating a sampling phase error signal for adjustment of a sampling clock signal associated with the receiver, the method comprising the steps of:

sampling a received input signal to generate a plurality of samples;

generating a signal representative of a computed weighted linear combination of a predetermined number of the samples of the received input signal, the combination being a function of the samples and tap-weights of a finite impulse response filter associated with the receiver;

generating an error signal representative of the difference between an equalized sequence of samples of the received input signal and a decoded sequence of samples of the received input signal;

multiplying the weighted linear combination signal with the error signal to generate a phase error signal for adjusting the sampling clock signal associated with the receiver such that the sampling clock signal substantially matches a data rate associated with the input signal;

wherein a computation of the weighted linear combination includes:
choosing a representative signal of the communications channel; and
choosing weights of the weighted linear combination to compute the phase error for the representative signal using gradient descent.

6. The method of claim 5, further comprising the step of shaping the samples of the received input signal to generate equalized samples.

7. The method of claim 6, further comprising the step of decoding the equalized samples of the received input signal to generate decoded samples.

8. Apparatus for use in a communication channel receiver for generating a sampling phase error signal for adjustment of a sampling clock signal associated with the receiver, the apparatus comprising:

a phase error signal pre-computation circuit for generating a signal representative of a weighted linear combination of a predetermined number of samples of a received input signal in response to the samples and tap-weights of a finite impulse response filter associated with the receiver, wherein the phase error signal pre-computation circuit further performs the step of computing the weighted linear combination including choosing a representative signal of the communications channel, and choosing weights of the weighted linear combination to compute the phase error for the representative signal using gradient descent;

a circuit for generating an error signal representative of the difference between an equalized sequence of samples of the received input signal and a decoded sequence of samples of the received input signal; and a phase error signal computation circuit coupled to the phase error pre-computation circuit and the error signal generation circuit for multiplying the weighted linear combination signal with the error signal to generate a phase error signal for adjusting the sampling clock signal associated with the receiver such that the sampling clock signal substantially matches a data rate associated with the input signal.

9. Apparatus for use in a communication channel receiver for generating a sampling phase error signal for adjustment of a sampling clock signal associated with the receiver, the apparatus comprising:

a phase error signal pre-computation circuit for generating a signal representative of a weighted linear combination of a predetermined number of samples of a received input signal in response to the samples and tap-weights of a finite impulse response filter associated with the receiver, wherein the phase error signal pre-computation circuit is one of an interleaved and non-interleaved architecture;

a circuit for generating an error signal representative of the difference between an equalized sequence of samples of the received input signal and a decoded sequence of samples of the received input signal; and a phase error signal computation circuit coupled to the phase error pre-computation circuit and the error signal generation circuit for multiplying the weighted linear combination signal with the error signal to generate a phase error signal for adjusting the sampling clock signal associated with the receiver such that the sampling clock signal substantially matches a data rate associated with the input signal.

10. The apparatus of claim 9, wherein the non-interleaved phase error signal pre-computation circuit comprises:

a plurality of delays for receiving samples of a received input signal and sequentially generating respective delayed samples in response thereto;

a pair of adders coupled to the plurality of delays for combining sequences of the delayed samples and an undelayed sample to generate a pair of respective sequences of samples;

a pair of multipliers coupled to the pair of adders for respectively multiplying the pair of sequences of samples by a pair of values to respectively generate a pair of signals, the values being a function of the tap-weights of the finite impulse response filter associated with the receiver; and an adder coupled to the pair of multipliers for adding the pair of signals to generate the signal representative of the weighted linear combination of the predetermined number of samples of the received input signal.

11. The apparatus of claim 9, wherein the interleaved phase error signal pre-computation circuit comprises:

a first pair of delays for receiving a first set of samples of the received input signal and sequentially generating respective delayed samples in response thereto;

a first adder coupled to the first pair of delays for combining a sequence of the delayed samples and an undelayed sample to generate a first sequence of samples;

a second pair of delays for receiving a second set of samples of the received input signal and sequentially generating respective delayed samples in response thereto;

a second adder coupled to the second pair of delays for combining a sequence of the delayed samples and an undelayed sample to generate a second sequence of samples;

a first pair of multipliers respectively coupled to the first and second adders for respectively multiplying the first and second sequences of samples by a first value and a second value to respectively generate a pair of signals, the values being a function of the tap-weights of the finite impulse response filter associated with the receiver;

a second pair of multipliers respectively coupled to the first and second adders for respectively multiplying a delayed first sequence of samples and the second sequence of samples by the second value and the first value to respectively generate a pair of signals;

a third adder coupled to the first pair of multipliers for adding the pair of signals to generate a first weighted linear combination signal; and a fourth adder coupled to the second pair of multipliers for adding the pair of signals to generate a second weighted linear combination signal.

12. Apparatus for use in a communication channel receiver for generating a sampling phase error signal for adjustment of a sampling clock signal associated with the receiver, the apparatus comprising:

a phase error signal pre-computation circuit for generating a signal representative of a weighted linear combination of a predetermined number of samples of a received input signal in response to the samples and tap-weights of a finite impulse response filter associated with the receiver;

a circuit for generating an error signal representative of the difference between an equalized sequence of samples of the received input signal and a decoded sequence of samples of the received input signal; and a phase error signal computation circuit coupled to the phase error pre-computation circuit and the error signal generation circuit for multiplying the weighted linear combination signal with the error signal to generate a phase error signal for adjusting the sampling clock signal associated with the receiver such that the sampling clock signal substantially matches a data rate associated with the input signal, wherein the phase error signal computation circuit is one of an interleaved and non-interleaved architecture.

13. The apparatus of claim 12, wherein the non-interleaved phase error signal computation circuit comprises:

a first multiplier for multiplying the weighted linear combination signal with the error signal; and a second multiplier coupled to the first multiplier for multiplying an output signal of the first multiplier with a constant value to generate the phase error signal, the constant value being a function of the tap-weights of the finite impulse response filter associated with the receiver.

14. The apparatus of claim 12, wherein the interleaved phase error signal computation circuit comprises:

a first multiplier for multiplying a first weighted linear combination signal with a first error signal;

a second multiplier for multiplying a second weighted linear combination signal with a second error signal;

an adder coupled to the first and second multipliers for adding respective output signals of the first and second multipliers; and a third multiplier coupled to the adder for multiplying an output signal of the adder with a constant value to generate the phase error signal, the constant value being a function of the tap-weights of the finite impulse response filter associated with the receiver.

15. Apparatus for use in a communication channel receiver for generating a sampling phase error signal for adjustment of a sampling clock signal associated with the receiver, the apparatus comprising:

a phase error signal pre-computation circuit for generating a signal representative of a weighted linear combination of a predetermined number of samples of a received input signal in response to the samples and tap-weights of a finite impulse response filter associated with the receiver, wherein the phase error signal pre-computation circuit further performs the step of computing the weighted linear combination including choosing a representative signal of the communications channel, and choosing weights of the weighted linear combination to compute the phase error for the representative signal using gradient descent;

a circuit for generating an error signal representative of the difference between an equalized sequence of samples of the received input signal and a decoded sequence of samples of the received input signal;

a phase error signal computation circuit coupled to the phase error pre-computation circuit and the error signal generation circuit for multiplying the weighted linear combination signal with the error signal to generate a phase error signal for adjusting the sampling clock signal associated with the receiver such that the sampling clock signal substantially matches a data rate associated with the input signal; and a phase correction circuit coupled to the phase error signal computation circuit for generating a phase correction signal as a function of the phase error signal.

16. The apparatus of claim 15, further comprising an oscillator circuit coupled to the phase correction circuit for applying the phase correction signal to the sampling clock signal in order to adjust the sampling clock signal.

17. Apparatus for use in a communication channel receiver for generating a sampling phase error signal for adjustment of a sampling clock signal associated with the receiver, the apparatus comprising:

a sampling circuit for sampling a received input signal to generate a plurality of samples;

a phase error signal pre-computation circuit for generating a signal representative of a weighted linear combination of a predetermined number of the samples of the received input signal in response to the samples and tap-weights of a finite impulse response filter associated with the receiver, wherein the phase error signal pre-computation circuit further performs the step of computing the weighted linear combination including choosing a representative signal of the communications channel, and choosing weights of the weighted linear combination to compute the phase error for the representative signal using gradient descent;

a circuit for generating an error signal representative of the difference between an equalized sequence of samples of the received input signal and a decoded sequence of samples of the received input signal; and a phase error signal computation circuit coupled to the phase error pre-computation circuit and the error signal generation circuit for multiplying the weighted linear combination signal with the error signal to generate a phase error signal for adjusting the sampling clock signal associated with the receiver such that the sampling clock signal substantially matches a data rate associated with the input signal.

18. The apparatus of claim 17, wherein the finite impulse response filter shapes the samples of the received input signal to generate equalized samples.

19. The apparatus of claim 18, further comprising a decoding circuit coupled to the filter for decoding the equalized samples of the received input signal to generate decoded samples.

20. Apparatus for use in a communication channel receiver for generating a sampling phase error signal for adjustment of a sampling clock signal associated with the receiver, the apparatus comprising at least one processor operable for:

generating a signal representative of a weighted linear combination of a predetermined number of samples of a received input signal in response to the samples and tap-weights of a finite impulse response filter associated with the receiver;

generating an error signal representative of the difference between an equalized sequence of samples of the received input signal and a decoded sequence of samples of the received input signal; and multiplying the weighted linear combination signal with the error signal to generate a phase error signal for adjusting the sampling clock signal associated with the receiver such that the sampling clock signal substantially matches a data rate associated with the input signal;

wherein the processor is further operable for computing the weighted linear combination including choosing a representative signal of the communications channel, and choosing weights of the weighted linear combination to compute the phase error for the representative signal using gradient descent.

21. Apparatus for use in a communication channel receiver for generating a sampling phase error signal for adjustment of a sampling clock signal associated with the receiver, the apparatus comprising at least one processor operable for:

generating a signal representative of a weighted linear combination of a predetermined number of samples of a received input signal in response to the samples and tap-weights of a finite impulse response filter associated with the receiver;

generating an error signal representative of the difference between an equalized sequence of samples of the received input signal and a decoded sequence of samples of the received input signal;

multiplying the weighted linear combination signal with the error signal; and multiplying the product of the weighted linear combination signal and the error signal by a constant value to generate a phase error signal for adjusting the sampling clock signal associated with the receiver such that the sampling clock signal substantially matches a data rate associated with the input signal.

22. Apparatus for use in a communication channel receiver for generating a sampling phase error signal for adjustment of a sampling clock signal associated with the receiver, the apparatus comprising at least one processor operable for:

generating a signal representative of a weighted linear combination of a predetermined number of samples of a received input signal in response to the samples and tap-weights of a finite impulse response filter associated with the receiver;

generating an error signal representative of the difference between an equalized sequence of samples of the received input signal and a decoded sequence of samples of the received input signal;

multiplying the weighted linear combination signal with the error signal to generate a phase error signal for adjusting the sampling clock signal associated with the receiver such that the sampling clock signal substantially matches a data rate associated with the input signal; and generating a phase correction signal as a function of the phase error signal;

wherein the processor is further operable for computing the weighted linear combination including choosing a representative signal of the communications channel, and choosing weights of the weighted linear combination to compute the phase error for the representative signal using gradient descent.

23. The apparatus of claim 22, wherein the processor is further operable for applying the phase correction signal to the sampling clock signal in order to adjust the sampling clock signal.

24. Apparatus for use in a communication channel receiver for generating a sampling phase error signal for adjustment of a sampling clock signal associated with the receiver, the apparatus comprising at least one processor operable for:

sampling a received input signal to generate a plurality of samples generating a signal representative of a weighted linear combination of a predetermined number of the samples of the received input signal in response to the samples and tap-weights of a finite impulse response filter associated with the receiver;

generating an error signal representative of the difference between an equalized sequence of samples of the received input signal and a decoded sequence of samples of the received input signal; and multiplying the weighted linear combination signal with the error signal to generate a phase error signal for adjusting the sampling clock signal associated with the receiver such that the sampling clock signal substantially matches a data rate associated with the input signal;

wherein the processor is further operable for computing the weighted linear combination including choosing a representative signal of the communications channel, and choosing weights of the weighted linear combination to compute the phase error for the representative signal using gradient descent.

25. The apparatus of claim 24, wherein the processor is further operable for shaping the samples of the received input signal to generate equalized samples.

26. The apparatus of claim 25, wherein the processor is further operable for decoding the equalized samples of the received input signal to generate decoded samples.

* * * * *

UNITED STATES PATENT AND TRADEMARK OFFICE
CERTIFICATE OF CORRECTION

PATENT NO. : 6,650,699 B1
DATED : November 18, 2003
INVENTOR(S) : Jose A. Tierno It is certified that error appears in the above-identified patent and that said Letters Patent is hereby corrected as shown below:

Column 4,
Line 55, correct equation (2) to read as follows:

$$E_n = \left( \sum_{i=0}^{m-1} t_i \times S_{n-i} \right) - \overline{Y}_n \qquad (2)$$

Column 5,
Line 41, correct equation (10) to read as follows:

$$\approx \frac{1}{M^2} (A \times dB - B \times dA) \qquad (10)$$

Column 15,
Line 22, add a ";" after "samples" and begin a new paragraph starting with "generating".

Signed and Sealed this

Sixteenth Day of March, 2004

JON W. DUDAS
*Acting Director of the United States Patent and Trademark Office*